May 27, 1958 C. W. MUELLER 2,836,522

JUNCTION TYPE SEMICONDUCTOR DEVICE
AND METHOD OF ITS MANUFACTURE
Filed Sept. 29, 1955

INVENTOR.
CHARLES W. MUELLER
BY J. L. Whittaker
ATTORNEY

United States Patent Office 2,836,522

Patented May 27, 1958

2,836,522

JUNCTION TYPE SEMICONDUCTOR DEVICE AND METHOD OF ITS MANUFACTURE

Charles W. Mueller, Princeton, N. J., assignor to Radio Corporation of America, a corporation of Delaware Application September 29, 1955, Serial No. 537,385

11 Claims. (Cl. 148—1.5)

Figure 1:
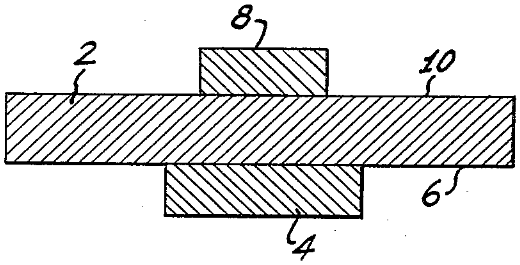

This application is a continuation-in-part of my copending application, Serial No. 320,766, filed November 15, 1952. This invention relates to improved methods of making junction type semiconductor devices and to improved devices resulting from the methods. More particularly, the invention relates to improved methods and devices in which one or more P–N junctions are formed by alloying into a body on N-type germanium or silicon a particular combination of metals which are capable of imparting P-type conductivity characteristics to N-type germanium.

By N-type germanium is meant semiconducting germanium having an excess of negatively charged current carriers, i. e., electrons, in its crystal lattice. By P-type germanium is meant semiconducting germanium having an excess of electron-deficiency centers or so-called "holes." N-type germanium may be prepared by adding very small amounts of elements such as antimony, arsenic, phosphorus, or bismuth to germanium which has been purified so that it approaches intrinsic purity and has a resistivity of 20 to 50 ohm-cm. P-type germanium can be prepared by adding very small amounts of elements such as indium, aluminum, gallium, or boron. An electrical rectifying barrier, known as a P–N junction, is formed at the interface between an N-type region and a P-type region in a body of crystalline semiconducting material such as germanium or silicon.

One method of forming P–N junctions in N-type semiconducting germanium or silicon has included the step of surface alloying a quantity of one of the P-type-imparting impurities such as indium upon a wafer of N-type material in order to form a P-type conductivity zone adjacent to a zone of N-type conductivity. Indium has been preferred for this purpose because of its relatively low melting point, its softness and its general ease of handling. It also alloys readily with germanium.

It has previously been found, however, that in making some types of semiconductor devices, especially where it is desirable to use very thin wafers, indium alloys so readily with germanium and silicon that its rate of penetration is difficult to control. Because of this, a large proportion of the devices are often spoiled. In order to avoid this difficulty in connection with germanium devices it has previously been suggested that the indium be first alloyed with a minor percentage of germanium before it is introduced into the germanium wafer for the purpose of forming a P–N junction. This slows down the rate of alloying with the germanium wafer and better control can be exercised over the rate of penetration. Although this method has resulted in some improvement over using indium alone, it has now been found that further improvement can be obtained by alloying the indium with other P-type-imparting impurities as more particularly described hereinafter, instead of first alloying it with germanium.

In general, the manufacture of a transistor using this process of forming P–N junctions includes the steps of forming a thin wafer of germanium or silicon of one conductivity type, placing on opposing surface portions of this wafer small quantities of an impurity substance capable of imparting opposite type conductivity to the wafer and then heating the assembly in order to diffuse the impurity substance into the wafer such that P–N junctions are formed within the wafer.

In making transistors which are suitable for high frequency applications there are several requirements which must be met in addition to those required for low frequency use. These additional requirements are:

(1) Low base resistance
(2) Minimum transit time dispersion of minority current carriers
(3) Low junction capacity In order to make transistors having low base resistances, base material having relatively low resistivity should be used, i. e., of the order of .2 to .8 ohm-cm. However, when using low resistivity semiconductor material, processing is considerably more difficult to obtain good P–N junctions. One of the characteristics of a good transistor is that its two P–N junctions be substantially flat and parallel as well as close together within the body of semiconducting material. In order to achieve optimum results in this respect, it has been found desirable to form the junctions upon very thin sections of semi-conductive wafers, that is, upon sections having a thickness of only about .002 inch, or even less. But when alloying pure indium into very thin germanium or silicon wafers, as mentioned above, it is very difficult to prevent the indium from penetrating too far into the wafers thus electrically shorting out the junctions and making the units useless. If thicker wafers are used to avoid the difficulty, the junctions usually are not properly spaced and also do not have the desired flat shape.

In a P–N–P type transistor the emitter electrode is biased such that it injects "holes" as signal current carriers. In order to produce an output signal the holes must pass through the P–N barriers from the emitter to the collector electrode. Since the opposing surfaces of the P–N junctions within the wafer are never perfectly parallel, and for other reasons, the holes leaving different parts of the emitter barrier, i. e., the P–N junction associated with the emitter electrode, at any one time become dispersed on their way toward the collector barrier and arrive at different times. This effect is known as transit time dispersion and is to be avoided if good high frequency characteristics are desired. Closely spacing the P-N junctions and improving the flatness of the junction surfaces is desirable for improving the operation of the device.

In transistors to be used for high frequency operation, low junction capacity is also desirable. Low junction capacity requires small junction areas and relatively thick transition regions at the junction sites. The transition regions are the regions, or zones in the semiconducting wafers which include the junctions and conductivity gradients from one type of conductivity to the other.

One object of the present invention is to provide improved methods of manufacturing P–N–P type junction transistors.

Another object of the invention is to provide an improved method of making P–N junction semiconductor devices.

Another object of the present invention is to provide improved methods of making junction type transistors suitable for high frequency uses.

Another object of the invention is to provide improved methods of making P–N junction semiconductor devices in which the P–N junctions exhibit relatively low capacity.

Another object of the invention is to provide improved methods of making P–N junction devices having relatively thick transition regions.

Still another object of the invention is to provide improved P–N junction devices particularly adapted for high frequency uses.

These and other objects are accomplished in accordance with the present invention which comprises an improved method of manufacturing P–N–P type junction transistors such that they will have the previously listed desirable characteristics making them suitable for high frequency uses. The improved method includes alloying indium, which is the principal P-type-imparting impurity, with small percentages of aluminum such that the rate of alloying of the impurity substance with germanium or silicon is decreased but the penetration by diffusion of the impurity substance into the semiconductor is apparently increased, thereby forming thicker transition regions. The invention also includes improved devices made by the improved method of the invention.

Figure 2:
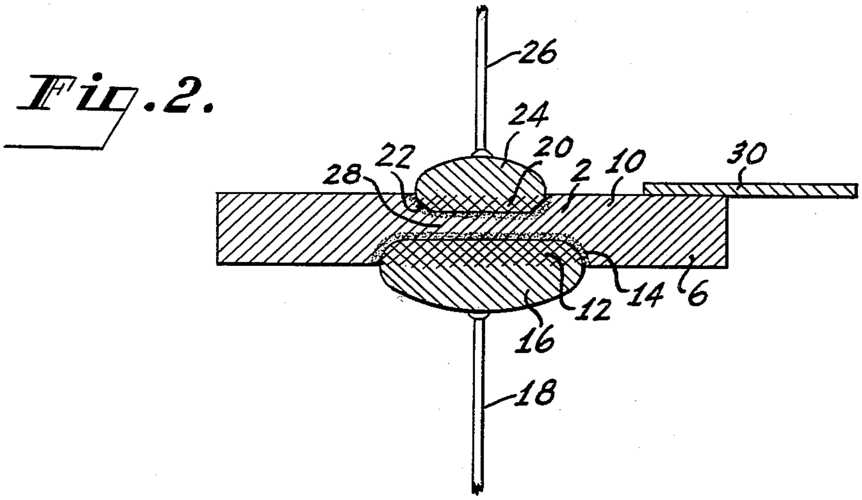

The invention will be described in greater detail with reference to the accompanying drawing of which:

Figure 1 is a cross-section elevation view of a device in accordance with the present invention during a preliminary stage of manufacture, and Figure 2 is a view similar to that of Figure 1 of the device during a later stage of manufacture.

In general, the method is similar to that described in an article by Law, Mueller, Pankove and Armstrong in the Proceedings of the I. R. E. for November 1952, except that the electrode material is different. Quantities of the impurity substance, indium-aluminum in this case, are alloyed into different surface portions of a germanium or silicon body in order to form closely spaced P–N junctions within the body of the material. Electrode connections are then made to the alloyed portions and a base electrode is attached to the wafer. In operating the device as a transistor, one of the alloy areas is biased positively to function as the emitter electrode and the other alloyed area is biased negatively to function as the collector electrode.

In accordance with a preferred embodiment of a method of the present invention, and referring first to Figure 1 to prepare a P–N–P transistor there may first be provided a wafer 2 of semiconducting germanium which has been doped with any of the usual N-type imparting impurities. Sufficient of the impurity substance may be added, for example, such that the resistivity of the germanium is about .6 ohm-cm. The wafer may be etched in a conventional etching solution such as a solution comprising 4 cc. concentrated hydrofluoric acid, 2 cc. concentrated nitric acid, and 200 mg. of cupric nitrate in 4 cc. distilled water, until it has a thickness of about .002 inch. Although the other dimensions of the wafer are not at all critical, the wafer may be made very small, for example, it may have a length and width of only ¼ inch and ⅛ inch respectively.

The impurity substance is then prepared by alloying with indium a minor percentage of aluminum. It is preferred to alloy from about 5 atomic percent to about 12 atomic percent of aluminum with a quantity of indium. This may be accomplished by melting the two substances together in a vacuum furnace, mixing thoroughly, cooling the melt, and then rolling the product into sheet form. When amounts of aluminum are used in the upper portion of the range, it is also desirable to quench the alloy during the cooling process so that aluminum may not separate out or become segregated in any one portion of the alloy.

From the sheet of aluminum-indium alloy thus prepared, discs are punched having a diameter of about .025 inch. The thickness of the disc is preferably about .005 inch. One of these discs 4 is attached to one of the faces 6 of the germanium wafer 2 by heating for about one minute at 450° to 500° C. in a hydrogen atmosphere. Discs having a diameter of about .01 inch are also punched from the alloy sheet and one of these 8 is attached to the opposite face 10 of the germanium wafer. The assembly is then heated for about 3 to 5 minutes at temperatures between about 500° to 525° C. in a hydrogen atmosphere.

After cooling, the unit is immersed in an etching solution which may comprise 10 cc. of 70% concentrated nitric acid, 10 cc. of 52% concentrated hydrofluoric acid, and 10 cc. of distilled water for about thirty seconds at room temperature. This is for the purpose of removing from the surfaces, portions of the alloy which may have flowed along the surface thus shorting out the electrode area with the germanium water. Etching brings out the P–N junctions at the surface of the unit around the portions of alloy. After etching, the unit may be plunged into running hot water (60° C.) for about one minute and then dried in a warm air blast.

After etching, and attaching a base lead 30 and emitter and collector leads 26 and 18 respectively, the unit has the appearance illustrated in Figure 2. Referring now to this figure, a portion of the larger disc 4 of impurity substance has penetrated into the face 6 of the semiconductor wafer to form a region 12 which is increasingly rich in germanium approaching the center of the wafer and increasingly rich in alloy of impurity substance toward the surface 6 of the wafer. Where the region becomes sufficiently deficient in impurity substance such that semiconducting properties are present, the semiconductor is converted to P-type conductivity characteristics. Around the periphery of the region, a P–N rectifying barrier 14 is formed. A portion 16 of the alloy disc does not penetrate into the germanium wafer but remains projecting above the surface thereof. To this portion, a lead 18 may be soldered. In a similar manner a portion of the smaller alloy disc 8 penetrates into the surface 10 of the semiconductor wafer to form an alloy region 20 which has P-type conductivity characteristics in that part of the region which is closest to the center of the germanium wafer. Around the periphery thereof, a P–N rectifying barrier 22 is formed. A portion 24 of the original alloy disc remains projecting above the surface of the wafer and to this portion an electrode lead 26 may be soldered.

Between the P–N rectifying barriers 14 and 22, there remains a narrow region 28 into which the impurity substance has not penetrated As previously stated, this region should be made as narrow as possible without shorting the two electrode regions.

The device may be substantially completed by attaching a base lead 30 in the form of a nickel tab to either face of the semiconductor wafer. This tab may conveniently be attached before heating the assembly to bring about the alloying and diffusing of the impurity substances into the wafer. If the base tab is attached at that time, care must be exercised later to see that the etching solution does not contact it.

When atomic percentages between the range of about 2 to 6 of aluminum are used in the impurity substance alloy, it has been found that best results are obtained insofar as making devices with desirable electrical characteristics are concerned. Using this range of percentage of aluminum, transistors may be made having a power gain greater than 20 db at one megacycle and greater than 5 db at ten megacycles. In some of these transistors the spacing between P–N junctions is about .0005 inch. The reasons for obtaining the improved operating characteristics in using the alloy of impurity substances are not entirely understood. It is a fact, however, that indium alloys more rapidly with germanium than alloys of indium and aluminum. It is also believed that because of the smaller atomic radius of aluminum the diffusion rate of the alloy is increased and thicker transition regions are thus formed. Because these relatively thick regions can be formed rapidly, very short heating periods can be used and very thin wafers can be utilized. In general, it has been found that using thin wafers and short heating times, P–N junctions having flat, parallel faces tend to be formed and these can be closely spaced. This lowers the transit time dispersion of the signal current carriers since the dispersion is less as the distance between the P–N barriers is lessened and as the barriers are made more nearly parallel. In addition, the more closely the emitter and collector P–N junctions are spaced, the smaller may be the size of the collector junction in relation to the emitter junction without noticeably increasing the loss of carriers due to surface recombination. The smaller the collector area the lower is its capacity, and this factor also improves operation at high frequencies. It is likely that other factors also contribute to the improvement in the devices prepared by the method of the present invention. For example, the use of aluminum in addition to indium, may change the action at the interface between the impurity substance alloy and the germanium, but this is not thoroughly understood.

Although a simple P–N–P transistor has been described in the example, it is obvious that any desired number of P–N junctions may be formed in the same body of germanium semiconductor material by this method and that these may be arranged in any desired manner. The method is intended to be a general one applicable to the formation of any P–N junction which is formed by alloying a portion of an impurity substance into a surface of a body of semiconducting germanium or silicon. Thus, single P–N junction devices are also included. The firing temperatures are generally somewhat higher in the case of silicon than with germanium, but otherwise the process steps are similar.

A number of variations can be made in the above-described method without departing from the scope of the present invention. The temperature of heating and the time, although critical for any one thickness of semiconductor wafer and impurity alloy composition, will, of course, vary considerably as electrode arrangement desired, wafer thickness, and impurity alloy composition are varied. Many different etching solutions are suitable for treatment after the heating steps. These have now become well known and conventional. If high frequency operation is not desired, the resistivity of the N-type germanium may vary widely, for example, up to 20 ohm-cm. or more.

There have thus been described improved methods of making P–N junction type semiconductor devices which are especially suitable for making P–N–P type transistors for operation at high frequencies but which can be also used for making devices suitable for other purposes.

What is claimed is:

1. An electrical device comprising a body of semiconducting material selected from the group consisting of germanium and silicon, said body including a P-type region containing alloy impurity material composed of indium and above 0.5 to about 12 atomic percent aluminum, and also including an N-type region separated from said P-type region by a rectifying barrier.

2. An electrical device comprising a body of semiconducting material selected from the group consisting of germanium and silicon, said body including at least two P-type regions each containing alloy impurity material composed of indium and above 0.5 to about 12 atomic percent aluminum, and also including at least one N-type region separated from said P-type regions by rectifying barriers.

3. A junction type semiconductor device including a body of semiconducting material selected from the group consisting of germanium and silicon and a surface alloyed electrode consisting essentially of indium and above 0.5 to about 12 atomic percent aluminum.

4. A transistor suitable for high frequency operation comprising a wafer of N-type semiconducting germanium having at least a portion with a thickness of the order of 0.002 inch and including two regions of P-type conductivity separated from said N-type region by P–N rectifying barriers, said barriers being spaced apart about 0.0005 inch, and said P-type regions including an above 0.5 to about 12 atomic percent impurity material composed of indium and aluminum.

5. A transistor according to claim 4 in which said N-type germanium has a resistivity of about 0.2 to 0.8 ohm-cm.

6. A method of making an electrical device comprising surface alloying with a portion of a body of N-type semiconducting material selected from the group consisting of germanium and silicon at least one quantity of an alloy composed of indium and above 0.5 to about 12 atomic percent of aluminum to form regions of P-type conductivity separated from the remainder of said N-type body by P–N rectifying barriers.

7. A method according to claim 6 in which the amount of aluminum in said alloy is from about 2 to about 6 atomic percent.

8. In a method of making a P–N–P transistor the step comprising surface alloying into opposite faces of a thin wafer of N-type semiconducting germanium, portions of an alloy composed of indium and from above 0.5 to about 12 atomic percent of aluminum such that two spaced apart P–N rectifying barriers are formed within said wafer.

9. A method according to claim 8 in which said aluminum is present within the range of 2 to 6 atomic percent.

10. A junction type semiconductor device comprising a body of N-conductivity type semiconducting material selected from the group consisting of germanium and silicon, and at least one electrode alloyed to a portion of the surface of said body, said electrode comprising an alloy of indium and above 0.5 to about 12 atomic percent aluminum.

11. A transistor comprising a wafer of N-conductivity type germanium, two quantities of indium-aluminum impurity material alloyed into opposite faces of said wafer, electrode connections to said alloyed portions, and a base electrode attached to said wafer, said indium-aluminum impurity material being composed of an alloy of indium and about 2 to about 6 atomic percent aluminum.

References Cited in the file of this patent

UNITED STATES PATENTS

| | | |
|---|---|---|
| 2,701,326 | Pfann et al. | Feb. 1, 1955 |
| 2,703,855 | Koch et al. | Mar. 8, 1955 |
| 2,705,767 | Hall | Apr. 5, 1955 |
| 2,725,315 | Fuller | Nov. 29, 1955 |
| 2,731,704 | Spanos | Jan. 24, 1956 |
| 2,742,383 | Barnes et al. | Apr. 17, 1956 |

UNITED STATES PATENT OFFICE

CERTIFICATE OF CORRECTION

Patent No. 2,836,522 May 27, 1958

Charles W. Mueller

It is hereby certified that error appears in the printed specification of the above numbered patent requiring correction and that the said Letters Patent should read as corrected below.

Column 1, line 22, for "body on" read -- body of --; column 3, line 59, for "5 atomic percent" read -- .5 atomic percent; column 4, line 14, for "germanium water" read -- germanium wafer --.

Signed and sealed this 22nd day of July 1958.

(SEAL)

Attest:

KARL H. AXLINE

Attesting Officer

ROBERT C. WATSON

Commissioner of Patents